(12) United States Patent
Yoshida

(10) Patent No.: US 6,661,709 B2
(45) Date of Patent: *Dec. 9, 2003

(54) NONVOLATILE SEMICONDUCTOR MEMORY DEVICE

(75) Inventor: Keiichi Yoshida, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/197,517

(22) Filed: Jul. 18, 2002

(65) Prior Publication Data

US 2003/0086299 A1 May 8, 2003

Related U.S. Application Data

(63) Continuation of application No. 09/894,133, filed on Jun. 29, 2001, now Pat. No. 6,501,682.

(30) Foreign Application Priority Data

Jul. 12, 2000 (JP) ...................................... 2000-211520

(51) Int. Cl.[7] .............................................. G11C 16/04
(52) U.S. Cl. ........................... 365/185.22; 365/185.22; 365/365; 365/185.11
(58) Field of Search ....................... 365/185.22, 185.11, 365/230.06; 257/723; 395/496, 183.18

(56) References Cited

U.S. PATENT DOCUMENTS

| | | | |
|---|---|---|---|
| 4,763,305 A | 8/1988 | Kuo ............................ | 365/200 |
| 4,914,576 A | 4/1990 | Zelley et al. ................ | 364/200 |
| 5,355,464 A | 10/1994 | Fandrich et al. ............ | 395/425 |
| 5,467,309 A * | 11/1995 | Tanaka et al. ......... | 365/185.14 |
| 5,519,847 A * | 5/1996 | Fandrick et al. ............ | 395/496 |
| 5,581,503 A | 12/1996 | Matsubara et al. ..... | 365/185.33 |
| 5,751,944 A * | 5/1998 | Roohparvar et al. ... | 395/183.18 |
| 5,764,586 A * | 6/1998 | Vanco et al. ........... | 365/230.06 |
| 5,809,340 A | 9/1998 | Bertone et al. .............. | 395/878 |
| 5,991,197 A | 11/1999 | Ogura et al. ........... | 365/185.11 |
| 6,073,208 A | 6/2000 | Norman ....................... | 711/103 |
| 6,078,518 A | 6/2000 | Chevallier ............. | 365/185.03 |
| 6,091,631 A | 7/2000 | Kucera et al. ......... | 365/185.03 |
| 6,172,911 B1 | 1/2001 | Tanaka et al. ......... | 365/185.22 |
| 6,501,682 B2 * | 12/2002 | Yoshida ................. | 365/185.22 |

* cited by examiner

*Primary Examiner*—David Nelms
*Assistant Examiner*—Thinh T. Nguyen
(74) *Attorney, Agent, or Firm*—Miles & Stockbridge P.C.

(57) ABSTRACT

The bit (B6) indicating whether there is the possibility or not to normally complete the write operation by executing again the write operation is provided, together with the bit (B7) indicating whether the access is possible or not from the external side of the chip and the bit (B4) indicating whether the write operation is normally completed or not, to the status register within a non-volatile semiconductor memory device. Accordingly, it can be prevented that the effective memory capacity is reduced with an accidental write error in the electrically programmable and erasable non-volatile semiconductor memory device such as a flash memory.

10 Claims, 9 Drawing Sheets

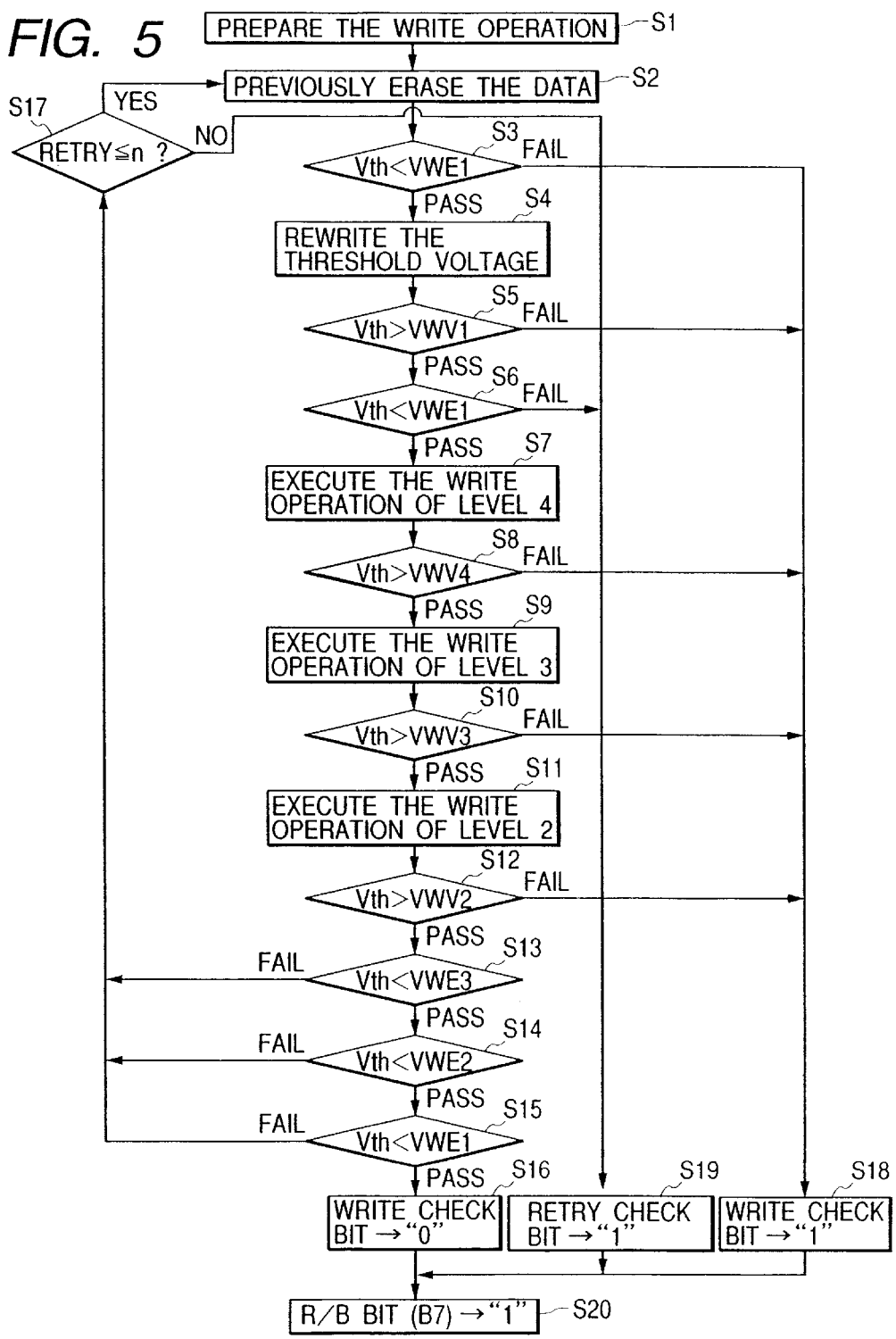

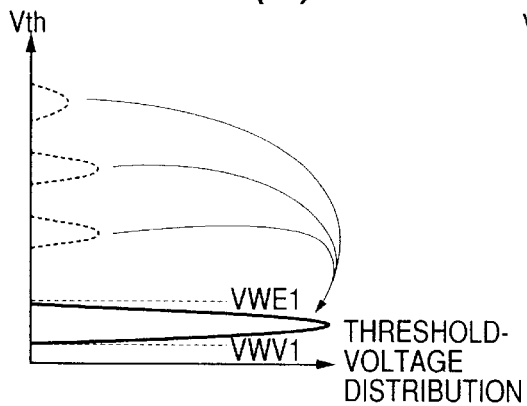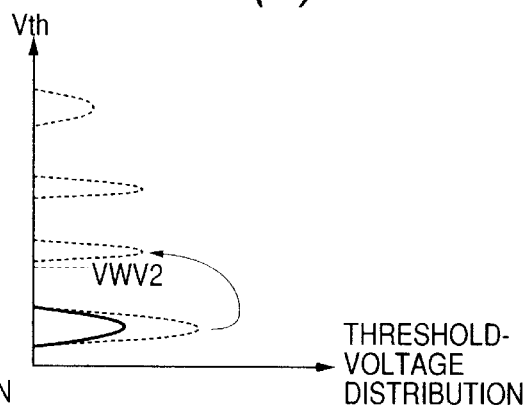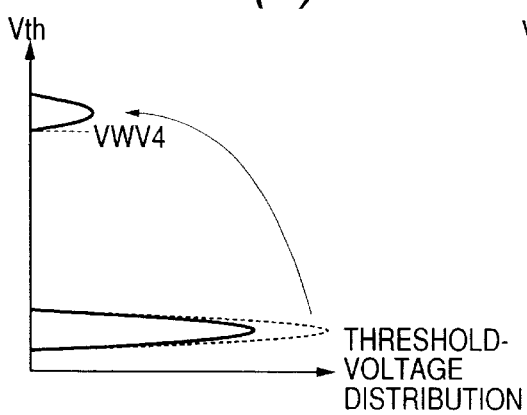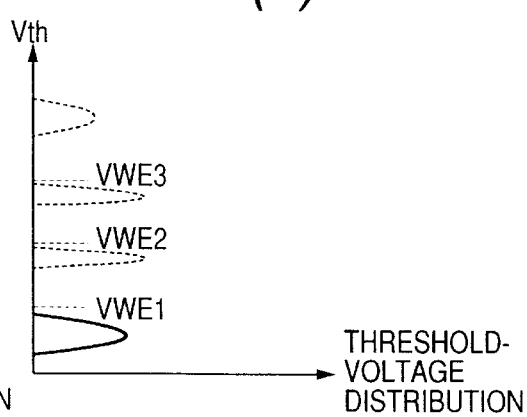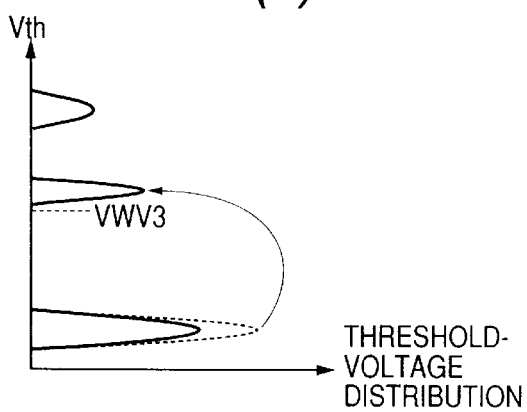

NONVOLATILE SEMICONDUCTOR MEMORY DEVICE

CROSS-REFERENCE TO RELATED APPLICATION

This application is a continuation of application Ser. No. 09/894,133 filed Jun. 29, 2001 now U.S. Pat. No. 6,501,682.

BACKGROUND OF THE INVENTION

The present invention relates to a technology effectively applicable to a method of controlling the internal conditions of a non-volatile memory which can electrically write or erase memory information, and more specifically to the technology effectively applicable, for example, to a flash memory.

A flash memory uses, as a memory cell, a non-volatile memory device consisting of a double-gate structure MOS-FET having a control gate and a floating gage and a threshold voltage of MOSFET can be varied to store information by changing a fixed amount of charges of the floating gate.

In such flash memory, change of the threshold voltage due to the write and erase operations to the memory cells fluctuates in respective operations depending on the operating conditions such as environment temperature even when the memory cells of the same kind having the identical characteristics are used and therefore the threshold voltages after the write and erase operations are distributed within a certain range. Moreover, a certain memory cell cannot vary the threshold voltage thereof up to the desired level with the single write and erase operation. Therefore, in the flash memory, a status register is generally provided therein to form the structure that if write and erase operations are not conducted accurately, such operations are stored as the write error and erase error.

A CPU which gives instruction of write and erase operations to the flash memory refers to the status register and registers the sector including a memory cell having generated an error as a defective sector and executes the process to remove such sector from the effective memory region of successive data.

However, a certain memory cell having generated the error explained above cannot vary the threshold voltage up to the desired level even after the write and erase operations are repeated, but another memory cell can conduct normal write operation when the write operation is repeated after the data is once erased (hereinafter, such error is referred to as an accidental fault). Particularly, in a multi-level flash memory for storing the data of 2-bit or more within only one memory cell, the range of threshold voltage corresponding to each memory information is narrower than that of the two-level memory and therefore such accidental error is generated easily.

SUMMARY OF THE INVENTION

However, in the flash memory of the prior art, detail error conditions of the sector having the bit where the write error has occurred have been never reflected on the status register. Therefore, it has become apparent that the sectors having generated error are all registered as the defective sectors and removed from the effective memory area, thereby resulting in the problem that the memory capacity of the memory as a whole is reduced.

It is therefore an object of the present invention to prevent reduction of memory capacity due to the accidental write error, in a non-volatile semiconductor device enabling electrical write and erase operations such as a flash memory.

It is another object of the present invention to easily analyze a fault such as write error, in a non-volatile semiconductor device enabling electrical write and erase operations such as a flash memory.

The aforementioned and other objects and novel features of the present invention will become apparent from the description of the present specification and the accompanying drawings.

The typical inventions of those disclosed in the present specification will be briefly explained below.

Namely, a bit indicating whether the access can be made from the external side of a chip or not, a bit indicating whether the write operation is completed normally or not and a bit indicating whether normal write operation is possible or not by executing again the write operation are provided in the status register within the non-volatile semiconductor memory device.

In more practical, a non-volatile semiconductor memory device comprising a plurality of memory cells for storing information depending on difference of the threshold voltage by changing this threshold voltage through application of the predetermined voltage to the selected memory cells and a status register indicating the internal conditions of a chip. The status register comprises a first bit indicating whether access can be made from external side of the chip or not, a second bit indicating whether the write operation is completed normally or not, and a third bit indicating whether the normal write operation is possible or not by executing again the write operation, and conditions of these bits can be outputted to the external terminal of the chip.

According to the means explained above, the chance for normal write operation can be increased even in the memory cell that has once generated a fault by reading the contents of the status register and then conducting the write operation again depending on the conditions of bits and thereby reduction of effective memory capacity due to the accidental write error can be prevented.

Moreover, the write operation to above memory cell is performed by once erasing the threshold voltage of the selected memory cell and then changing such threshold voltage to the voltage corresponding to the write condition depending on the write information. The third bit explained above is set to the condition indicating generation of an error in such a case that the threshold voltage of the memory cell to which the information is written exceeds the predetermined voltage range. Since the selected memory cell is once erased before the write operation, the write control sequence is simplified and moreover the third bit indicating whether the normal write operation is possible or not can be set easily by executing again the write operation.

In addition, the third bit is set to indicate generation of error in such a case that the threshold voltage of memory cell exceeds the predetermined voltage range of the threshold voltage corresponding to the write operation after the write operation to the selected memory cell has been executed exceeding the predetermined number of times. With such structure, the time required for single write operation can be limited and thereby the external control device such as CPU for making access to the relevant memory device can be protected from the long-term waiting condition.

The second bit is set to indicate generation of error in such a case that threshold voltage exceeds the predetermined voltage range of the threshold voltage in the erasing condition during the verify read operation that is conducted immediately after the threshold voltage of the selected memory cell is once erased. Since a memory cell that is determined by the verify operation to be defective becomes a defective cell with higher possibility even after the write operation is conducted again, such memory cell can be discriminated from the memory cell that is recovered as a normal cell after the write operation is conducted again.

The status register has the fourth bit indicating whether the threshold voltage of the memory cell to which the write operation is conducted exceeds or not the upper limit value or lower limit value of the predetermined voltage range of the threshold voltage corresponding to the writing condition. Accordingly, whether the threshold voltage of the memory cell generating a write error has exceeded the upper limit value or lower limit value can be discriminated and fault analysis can be realized very easily.

The memory cell explained above is constituted to store the information of three or more levels depending on the threshold voltage and the fourth bit explained above is composed of a plurality of bits indicating whether the fourth bit exceeds or not the predetermined voltage range corresponding to respective threshold voltages. Accordingly, it is now possible, in the memory device that can store multi-level information with the memory cell, to know which voltage range the threshold voltage of the memory cell having generated the verify error has exceeded and the fault analysis can be executed easily.

Contents of the status register are outputted to the external terminal when a plurality of control signals supplied from the external side of the chip are combined as specified. Accordingly, it is no longer required to provide a new control signal to read the contents of the status register.

Here, it is preferable to provide a structure that the condition of the first bit of the status register is always outputted to the exclusive external terminal of the chip. Accordingly, it can always be detected that the external control device such as CPU for making access to the relevant memory device can make access or not.

Moreover, contents of the status register is outputted to the external terminal that is used in common for the input of the write information supplied from the external side of the chip. Accordingly, the number of external terminals required for the relevant memory device can be reduced.

It is also possible that contents of the status register is outputted to the external terminal that is used in common for the input of the write address supplied from the external side of the chip. Accordingly, the number of external terminals required for the relevant memory device can further be reduced.

Here, a control circuit for executing the process based on a command code supplied from the external circuit is provided and a control signal for the internal circuit corresponding to the command code is formed. Accordingly, the status register is provided within this control circuit. Accordingly, the internal condition can easily be reflected on the status register.

Another invention of the present patent application is a non-volatile semiconductor device comprising a plurality of memory cells for changing the threshold voltage by applying the predetermined voltage to the selected memory cell and then storing the information depending on difference of the threshold voltages and a status register for indicating the internal condition of chip, whereby write operation to the memory cell is conducted by once erasing the threshold voltage of the selected memory cell and then changing such threshold voltage to the voltage corresponding to the write condition depending on the write information. After the threshold voltage is changed to the voltage corresponding to the erasing condition, whether the threshold voltage of the selected memory cell has exceeded or not the predetermined voltage range is determined; when the threshold voltage exceeds the predetermined voltage range, the condition indicating an error is set to the first bit of the status register; after the threshold voltage is changed to the voltage corresponding to the write condition depending on the write information, whether the threshold voltage of the selected memory cell has exceeded or not the upper limit value (or lower limit value) of the predetermined voltage range is determined; when the threshold voltage exceeds the predetermined range, the condition indicating an error is set to the second bit of the status register; after above determination, whether the threshold voltage of the selected memory cell exceeds or not the lower limit value (or upper limit value) of the predetermined voltage range is determined; when the threshold voltage does not exceed the predetermined range, the condition indicating an error is set to the third bit of the status register. Moreover, when the threshold voltage of the selected memory cell does not exceed the lower limit value (or upper limit value) of the predetermined voltage range, the write process is executed again. If the threshold voltage of the selected memory cell does not yet exceed the lower limit value (or upper limit value) of the predetermined voltage range even after the repeated write operation, the condition indicating an error is set to the fourth bit of the status register. Accordingly, setting of each bit forming the status register can be realized very effectively.

Moreover, the status register explained above also has the fifth bit for indicating whether access is possible or not from the external side of the chip and sets this fifth bit, on the occasion of starting the write operation, to the condition for inhibiting the access from the external side of the chip and also sets this fifth bit, after the above write operation and the setting of the first to fourth bits, to the condition for allowing access from the external side of the chip. In addition, condition of this fifth bit is always outputted to the exclusive external terminal. Accordingly, whether the relevant memory device is in the accessible condition or not can be quickly and accurately reflected on the status register.

BRIEF DESCRIPTION OF THE DRAWINGS

FIG. 5 is a flow chart of the write process and practical setting procedures of each bit of status register in the flash memory of the embodiment.

FIG. 6 is an explanatory diagram illustrating the relationship between change of threshold voltages and verify voltage in the write process depending on the flow chart of FIG. 5.

DETAILED DESCRIPTION OF THE PREFERRED EMBODIMENT

The preferred embodiment of the present invention will be explained with reference to the accompanying drawings.

Figure 1:
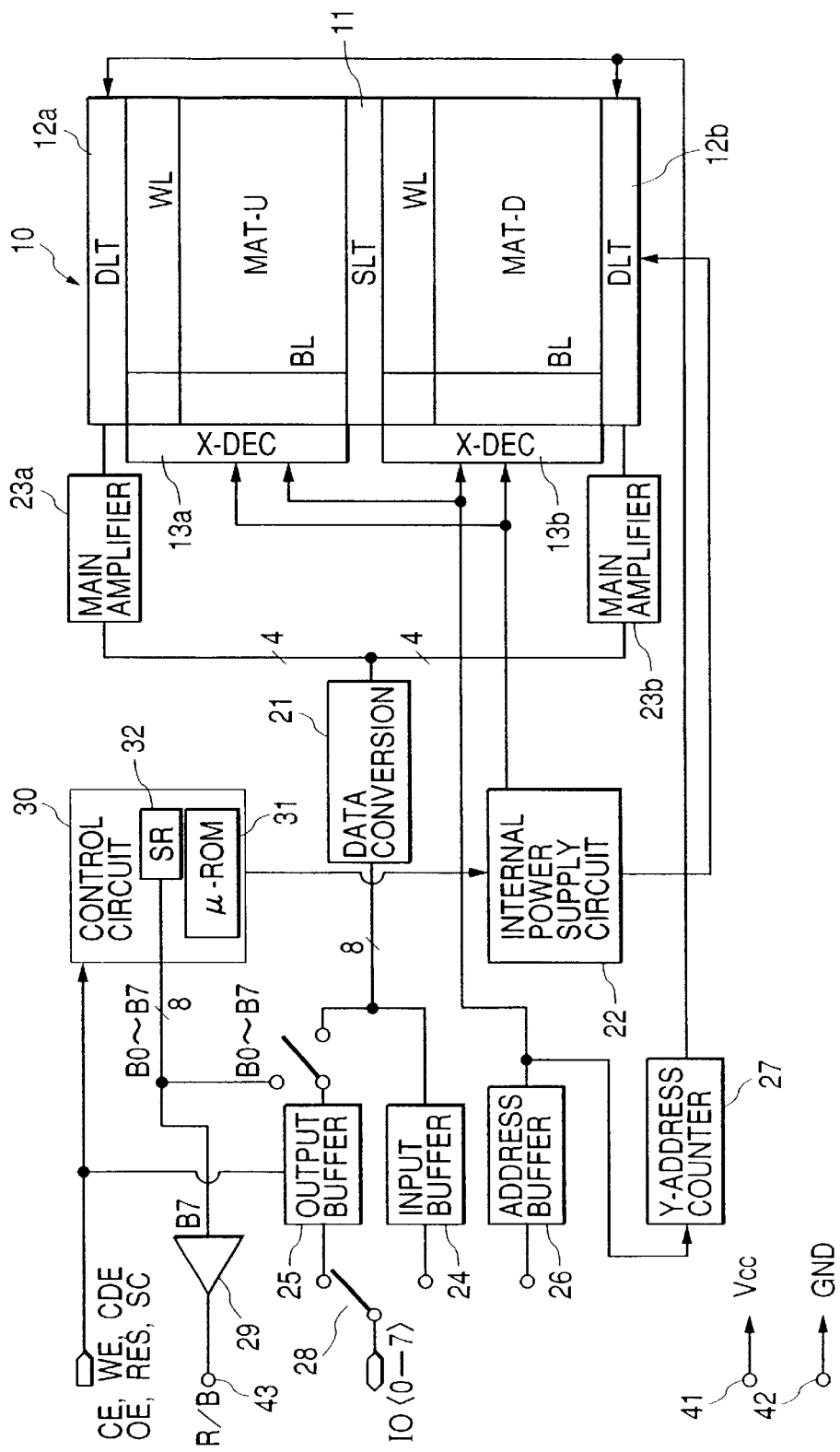
FIG. 1 is a block diagram illustrating an embodiment of the flash memory as an example of the semiconductor memory device that can effectively be applied to the present invention.

FIG. 1 is a block diagram of an embodiment of the flash memory as an example of a non-volatile semiconductor memory device that can effectively be applied to the present invention. Although not particularly restricted, the flash memory of this embodiment is formed as a multi-level memory that can store the data of 2-bit in only one memory cell and is formed on single semiconductor chip of the single crystal silicon.

In this embodiment, a memory array is formed of two mats and the sense & latch circuit (hereinafter referred to as sense latch and written as SLT) connected with a bit line BL in each mat to amplify and latch the read signal is allocated between two mats. Moreover, a latch circuit for temporarily holding the write and read data is allocated at the external side of mats, namely in the opposite side of the sense & latch circuit SLT sandwiching the bit line BL. Hereinafter, this latch circuit is called a data latch and is written as DLT in the figure.

In FIG. 1, reference numeral 10 designates a memory array formed of a couple of mats MAT-U, MAT-D; 11, sense latch column including the sense latch SLT allocated between the memory mats MAT-U, MAT-D; 21, a data conversion circuit for converting the write data inputted from the external circuit into the 4-level data (3 bits) in every two bits in order to store the information of 4-level, namely by changing the threshold voltage of the memory cell in the four stages. On the memory mats MAT-U, MAT-D, the memory cells formed of MOSFETs of the double-gate structure having the floating gate and control gate are respectively allocated in the form of a matrix. The control gates of the memory cells in the same row are connected in common and formed continuously, in practical, to form a word line WL, while the drains of the memory cells in the same column can be connected to the common bit line BL.

The memory cell array 10 is provided with the X-system address decoders (word decoders) 13a, 13b respectively corresponding to the memory mats MAT-U, MAT-D. The decoders 13a, 13b include the word drive circuit for driving one word line WL in each memory mat to the selection level depending on the result of decoding.

Moreover, the data latch columns (DLT) 12a, 12b for holding the write data converted in the data conversion circuit 21 and the read data from the memory cell are respectively allocated at the external side (upper and lower directions in the figure) of the memory mat. In the case of storing the data in 4-level, the write data of 3-bit converted in the data conversion circuit 21 is held through the sharing to the data latch columns 12a, 12b and sense latch column (STL) 11. At the time of read operation, the data read from the memory cell is held in the data latch columns 12a, 12b and the sense latch 11 and is inversely converted adequately to the data of 2-bit through the logical operation.

The address decoder circuit of Y-system and the column switch that is selectively turned ON and OFF with this decoder to transfer the data from the data conversion circuit 21 to the corresponding sense latch are constituted integrally with the data latch columns 12a, 12b. In FIG. 1, this decoder circuit of Y-system, column switch and data latch circuit are indicated with only one function block (DLT).

The flash memory of this embodiment is constituted, although not particularly restricted, to provide a control circuit (sequencer) 30 which can interpret the command (instruction) given from the control device such as an external microprocessor and sequentially forms and outputs the control signals to each circuit in the memory to execute the process corresponding to the relevant command, in view of decoding, when the command is given, such command and then executing automatically the corresponding process. The control circuit 30 is constituted to provide a ROM (Read Only Memory) 31 storing, for example, a series of micro-instructions required for executing the commands in view of sequentially executing the micro-instructions to form a control signal for each circuit in the chip. Moreover, the control circuit 30 is also provided with a status register 32 for reflecting the internal conditions.

Moreover, the multi-level flash memory of this embodiment is also provided with an internal power supply circuit 22 for generating a high voltage used for write or erase operation, main amplifier circuits 23a, 23b for amplifying the signals read from the memory array 10, a buffer circuit 24 for fetching the write signal and commands inputted from the external circuit, an output buffer circuit 25 for outputting the data signal read from the memory array and contents of the status register 32 to the external circuit, an address buffer circuit 26 for fetching the address signal inputted from the external circuit and an address counter 27 for generating the address of Y-system through the count-up operation by fetching the input address signal or the like. The input buffer circuit 24, output buffer circuit 25 and address buffer circuit 26 are connected with the common input/output terminals I/O0 to I/O7 via the change-over switch 28 and is constituted to input or output the data, commands and address signals on the time-division basis.

The internal power supply circuit 22 is composed of a reference power source generating circuit for generating the reference voltage of the write voltage or the like, an internal power source generating circuit for generating, based on the power source voltage Vcc supplied from an outside, the voltages required within the chip such as the write voltage, erase voltage, read voltage and verify voltage or the like, a power source change-over circuit for selecting the desired voltage from such voltages and then supplying the selected voltage to the memory array 10 depending on the operating condition of the memory and a power supply control circuit for controlling these circuits or the like. In FIG. 1, numeral 41 designates a power source voltage terminal to which the external power source voltage Vcc is applied and 42, a power source voltage terminal (ground terminal) to which the ground potential Vss is applied.

As the control signals to be inputted to the flash memory of this embodiment from the external CPU or the like, for example, the reset signal RES, chip selection signal CE, write control signal WE, output control signal OE, command enable signal CDE indicating command, data input or address input and system clock SC or the like can be considered. The command and address are respectively fetched to the input buffer circuit 24 and address buffer circuit 26 depending on the command enable signal CDE and write control signal WE, while the write data is fetched to the input buffer circuit 24 in synchronization with the system clock SC when it is inputted, while the command enable signal CDE indicates the command or data input. Moreover, in this embodiment, an output buffer 29 is provided to output the ready/busy signal R/B indicating whether external access is possible or not to the external terminal 43 depending on the predetermined bit of the status register 32 reflecting the internal condition of memory.

Figure 2:
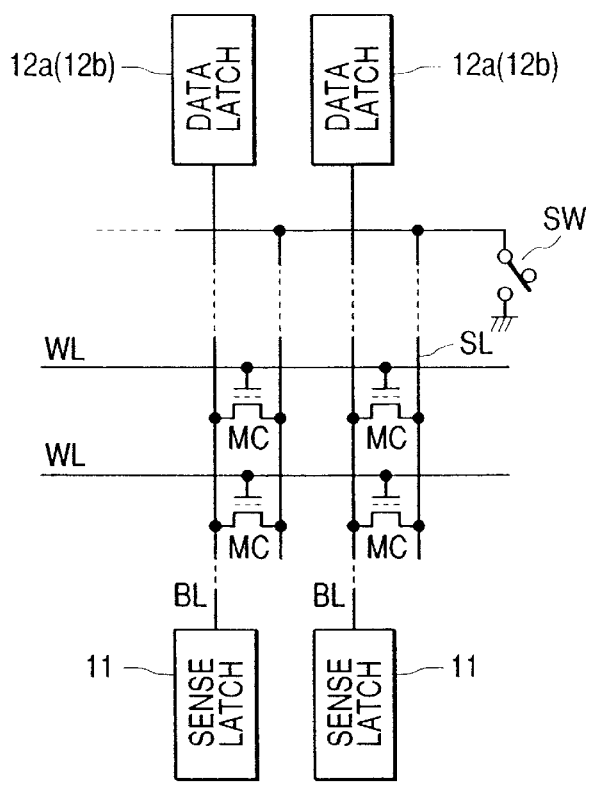
FIG. 2 is a circuit configuration diagram illustrating a schematic structure of a memory array.

FIG. 2 illustrates a schematic structure of the memory array 10. A plurality of memory cells MC are allocated in the memory array 10 in the form of a matrix, the word line WL connected to the control gates of the memory cells in the same row and the bit line BL connected to the drains of the memory cells of the same column are allocated to cross with each other and the source of each memory cell is connected to a common source line SL for giving the ground potential. The source line SL is also provided with a switch SW to give the open condition to the source of the memory cell during the write operation.

One end of each bit line BL is connected in every bit line with the sense latch circuit 11 having the sense amplifier function to amplify the potential of the bit lines and data holding function, while the other end of each bit line BL is connected in every bit line with the data latch circuit 12a (12b) having the data holding function. This data latch circuit 12a (12b) is used to hold the data for changing step by step the threshold voltage of the selected memory cell when it operates as the multi-level memory.

Moreover, the sense latch circuit 11 and data latch circuit 12a (12b) are provided with a switch element for connecting and disconnecting the corresponding bit line and a means for discharging the charges accumulated in the bit lines. The sense latch circuit 11 may also be provided with an inverting circuit for inverting the logic of the data on the bit lines. Since such switch element and inverting circuit are provided, in the case of storing the 4-level data, the data conversion to the 2-bit data can be conducted within the memory array with the wired arithmetic operation, on the bit lines, of the data read out from the memory cell by changing the read operation level.

Figure 3A:
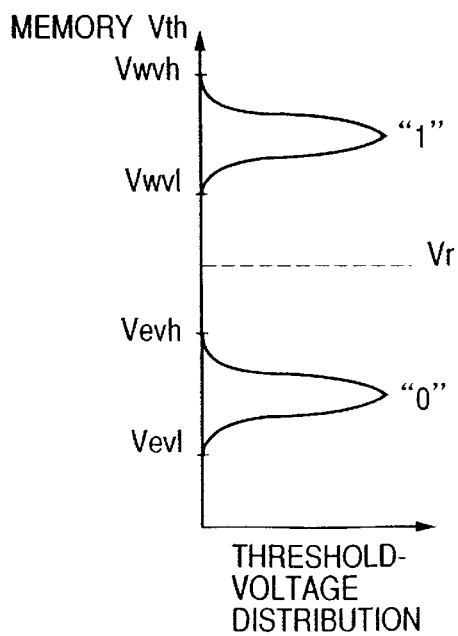
FIG. 3 is an explanatory diagram for illustrating distribution of the threshold voltages for storing the 2-level data and 4-level data to the memory cell.
Figure 3B:
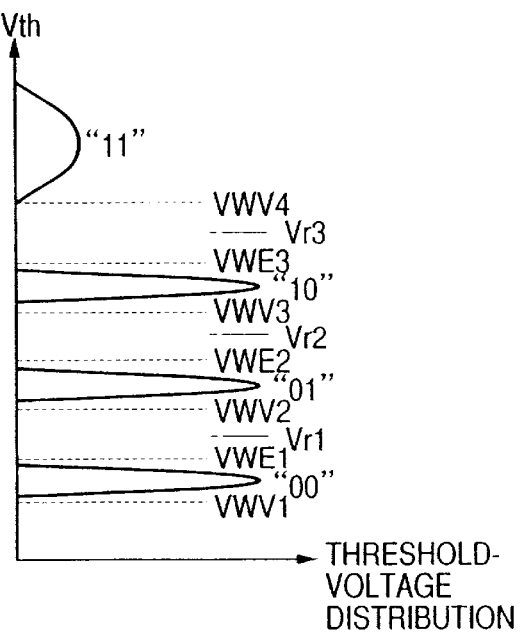

Although not particularly restricted, the flash memory of this embodiment is used to store the 2-level data and 4-level data to each memory cell. FIGS. 3(a), 3(b) respectively illustrate distribution of the threshold voltages on the occasion of storing the 2-level data or 4-level data to the memory cell. In the case of storing the 2-level data, the verify voltages Vwvh, Vwvl are set to place the threshold voltage of the memory cell corresponding to the memory data "1" to the range, for example, of 4.3V±0.7V. Moreover, the verify voltages Vevh, Vevl are set to place the threshold voltage of the memory cell corresponding to the memory data "0" within the range, for example, of 1.5V±0.7V. The read voltage Vr is set the intermediate level, such as 2.9V.

In the case of storing the 4-level data, the verify voltage VWV4 is set to place the threshold voltage of the memory cell corresponding to the memory data "11" to the voltage, for example, higher than 4.8V. Meanwhile, the verify voltages VWE3, VWV3, VWE2, VWV2, VWE1, VWV1 are respectively set to place the threshold voltage of memory cell corresponding to the memory data "10" to the range of 3.6V±0.4V, the threshold voltage of the memory cell corresponding to the memory data "01" to the range, for example, of 2.2V±0.4V and the threshold voltage of the memory cell corresponding to the memory data "00" to the range, for example, of 1.0V±0.4V. Moreover, the read voltages for 4-level data are respectively set to the levels of 1.5V, 2.9V and 3.8V.

Although not particularly restricted, in the flash memory of this embodiment, the threshold voltage is raised by applying, during the write operation, the positive high voltage (for example, +16V) to the word line WL (control gate) and then injecting negative charges to the floating gate of the memory cell by utilizing the FN tunnel phenomenon. Therefore, the bit line BL connected with the memory cell (for example, data "1") requested to raise the threshold voltage depending on the write data is not precharged, namely set to 0V. On the other hand, the bit line BL connected with the memory cell (for example, data "0") not requested to raise the threshold voltage is precharged to 5.5V. On the occasion of write operation, the source of each selected memory cell is floated (opened). At the time of erasing the data, a negative high voltage (for example, −16V) is applied to the word line WL (control gate) and 0V is then applied to the bit line BL and source line SL. Accordingly, the negative charges are extracted from the floating gate of the memory cell with the FN tunnel phenomenon to lower the threshold voltage thereof.

Table 1 illustrates a structural example of the status register 32 in the first embodiment of the present invention.

TABLE 1

| | Definition | "0" | "1" |
|---|---|---|---|
| B7 | Ready/Busy | Busy | Ready |
| B6 | Retry Check | — | Retry |
| B5 | Erase Check | Pass | Fail |
| B4 | Program Check | Pass | Fail |
| B3 | Reserved | — | — |
| B2 | Reserved | — | — |
| B1 | Reserved | — | — |
| B0 | Reserved | — | — |

The status register 32 of this embodiment is formed of 8 bits from the bit B7 to bit B0. Of these 8 bits, the bit B7 is the bit indicating the internal control condition of chip (hereinafter referred to as R/B bit) the bit B6 is the bit indicating whether re-write operation is conducted or not (hereinafter referred to as retry check bit), the bit B5 is the bit indicating the result of erasing operation (hereinafter referred to as erase check bit), the bit B4 is the bit indicating the result of write operation (hereinafter referred to as write check bit) and the bits B3 to B0 are auxiliary bits.

In more practical, when the bit B7 is logic "0", it indicates that the chip is in the operating condition and external access impossible. Moreover, when the bit B7 is logic "1", it indicates that the inside of the chip is in the waiting condition and the external access possible. In addition, when the bit B6 is logic "0", re-write operation is not conducted and when the bit B6 is logic "1", the re-write operation is conducted. When the bit B5 is logic "0", the erase operation is completed normally and when the bit B5 is logic "1", the erase operation is not completed normally. Moreover, when the bit B4 is logic "0", the write operation is completed normally and when the bit B4 is logic "1", the write operation is not completed normally.

Figure 4:
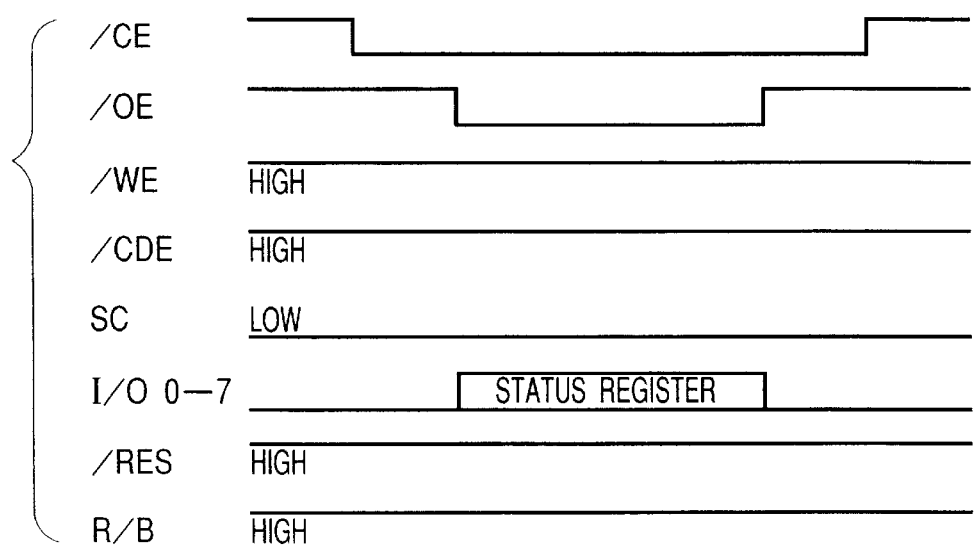
FIG. 4 is a timing chart of the timings for outputting the contents of the status register in the flash memory of an embodiment of the present invention.

State of the R/B bit B7 among the bits B7 to B0 of the status register 32 is always outputted to the external terminal 43 with the buffer 29 and when the chip-enable signal /CE and out-enable signal /OE supplied from the external circuit are asserted to the low level as illustrated, for example, in FIG. 4, all status of the bits B7 to B0 are outputted from the input/output terminals I/O7 to I/O0. Moreover, the bits B7 to B0 of the status register 32 are sequentially set with the control circuit 30 depending on the control condition. Next, the practical setting sequence of the bits to the bits B7 to B0 of the status register 32 will be explained considering the write operation as an example with reference to FIG. 5.

The flowchart of FIG. 5 starts when the write command is inputted to the flash memory from the external CPU. The control circuit 30 performs preliminary process (step S1), when the write command is recognized by decoding the input command, for fetch of the write address and write data and for setting of the logic "0" of the R/B bit B7 of the status register and thereafter once erases (the threshold voltage becomes lowest corresponding to the data "00") all memory cells of the write object sectors (hereinafter, referred to the selected sectors) as illustrated in FIG. 6(a) (step S2).

Next, it is determined the threshold voltage Vth of all memory cells in the selected sectors is lower than the erase verify voltage VWE1 or not (step S3). If there exists at least a memory cell having the threshold voltage higher than VWE1, the process jumps to the step S18 to set the write check bit to the logic "1" and moreover the R/G bit B7 is set to the logic "1" in the step S20 to complete the write process.

On the other hand, when it is determined in the step S3 that the threshold voltage Vth of all memory cells is lower than VWE1, the process goes to the step S4 to perform the slight write operation in view of raising the threshold voltage of the memory cells of which threshold voltages are lowered excessively. Next, it is then determined that the threshold voltage Vth of all memory cells in the selected sectors is higher than the verify voltage VWV1 (step S5). If there exists at least a memory cell having the threshold voltage lower than VWV1, the process jumps to the step S18 to set the write check bit to the logic "1" and moreover set the R/B bit B7 to the logic "1" in the step S20 thereby completing the write process.

When it is determined in the step S5 that the threshold voltage Vth of all memory cells is higher than the verify voltage VWV1, the process goes to the step S6 and it is determined again that the threshold voltage Vth of all memory cells is lower than the erase verify voltage VWE1. If there exists at least a memory cell having the threshold voltage higher than VWE1, the process jumps to the step S19 to set the retry check bit to the logic "1" and moreover the R/B bit B7 to the logic "1" in the step S20 in order to complete the write process.

On the other hand, when it is determined in the step S6 that the threshold voltage Vth of all memory cells is lower than VWE1, the process goes to the step S7 to perform the write operation (referred to as the write operation of level 4) for the memory cells for writing data "11", namely for the memory cells of which threshold voltage must be raised as illustrated in FIG. 6(b). Such selective write operation can be realized by applying a high voltage to the selected word lines after the bit line connected with the memory cells which are requested to raise the threshold voltage is recharged to 0V and the bit line connected with the memory cells which are not requested to raise the threshold voltage is precharged to the potential such as 5.5V. Thereafter, it is determined that the threshold voltage Vth of all memory cells to which the write operation of level 4 is performed in the selected sectors is higher than the verify voltage VWV4 (step S8). If there exists at least a memory cell having the threshold voltage lower than VWV4, the process jumps to the step S18 to set the write check bit to the logic "1" and set the R/B bit B7 to the logic "1" in the step S20 thereby completing the write operation.

When it is determined in the step S8 that the threshold voltage Vth of all memory cells in which the write operation of level 4 is performed becomes higher than VWV4, the process goes to the step S9 to perform the write operation (referred to as the write operation of level 3), as illustrated in FIG. 6(c), for the memory cell for writing the data "10", namely for the memory cell which is requested to raise the threshold voltage to the second highest voltage. Next, it is determined that the threshold voltage Vth of all memory cells having completed the write operation of level 3 within the selected sectors is higher than the verify voltage VWV3 (step S10). If there exists at least a memory cell having the threshold voltage which is lower than VWV3, the process jumps to the step to set the write check bit to the logic "1" and also set to the R/B bit B7 to the logic "1" in the step S20 in order to complete the write operation.

When it is determined in the step S10 that the threshold voltage Vth of all memory cells having completed the write operation of level 3 is higher than VWV3, the process goes to the step S11 to perform the write operation (referred to as the write operation of level 2) for the memory cell for writing the data "01", namely for the memory cell which is requested to raise the threshold voltage to the third highest voltage as illustrated in FIG. 6(d) Next, it is determined that the threshold voltage Vth of all memory cells having completed the write operation of level 2 in the selected sector is higher than the verify voltage VWV2 (step S12). If there exists at least a memory cell having the threshold voltage lower than VWV2, the process jumps to the step S18 to set the write check bit to the logic "1" and to set the R/B bit B7 to the logic "1" in the step S20 thereby completing the write operation.

When it is determined in the step S12 that the threshold voltage Vth of all memory cells having completed the write operation of level 2 is higher than VWV2, the process goes to the steps S13 to S15 to respectively determine, as illustrated in FIG. 6(e), that the threshold voltage of memory cell having completed the write operation of level 3 is lower than the verify voltage VWE3, the threshold voltage of the memory cell having completed the write operation of level 2 is lower than the verify voltage VWE2 and that the threshold voltage of the memory cell having completed no write operation is lower than the verify voltage VWE1.

Such determination can be realized by conducting the read operation after precharging the bit line using the write data stored in the data latch circuit.

When the verify voltage is satisfied in the determination of all steps of S13 to S15, the process goes to the step S16 to set the write check bit to "0" and thereafter set the R/B bit B7 to "1" in the step S20 in view of completing the write operation. Meanwhile, if there exists at least a memory cell which does not satisfy the verify voltage in the determination of the steps of S13 to S15, the process jumps to the step S17 to determine whether the number of times of write operation is less than "n" or not (n is 0 or positive integer, and it is generally set to "1"). When the number of times of write operation is less than "n", the process returns to the step S2 to perform again the write operation by repeating the operations explained above. Moreover, if there exists at least a memory cell which does not satisfy the verify voltage in the determination of the steps of S13 to S15 even after the retry of write operation, the process jumps to the step S19 from the step S17 to set the retry check bit B6 to the logic "1" and to set the R/B bit B7 to the logic "1" in the step S20 in view of completing the write operation. It is also possible to set the retry check bit B6 to the logic "1" without executing the retry of write operation by setting n to "0".

Table 2 indicates an example of structure of the status register 32 in the second embodiment of the present invention.

TABLE 2

|    | Definition    | "0"  | "1"        |
|----|---------------|------|------------|
| B7 | Ready/Busy    | Busy | Ready      |
| B6 | Retry Check   | —    | Retry      |
| B5 | Erase Check   | Pass | Fail       |
| B4 | Program Check | Pass | Fail       |
| B3 | Level 4 Check | —    | VWV4       |
| B2 | Level 3 Check | —    | VWV3/VWE3  |
| B1 | Level 2 Check | —    | VWV2/VWE2  |
| B0 | Level 1 Check | —    | VWV1/VWE1  |

The status register 32 of this embodiment is also formed of 8 bits of bit B7 to bit B0. The bits B7 to B4 among 8 bits are similar to that in the first embodiment (Table 1) The B7 is the R/B bit indicating the internal control condition of chip; B6 is a retry check bit indicating whether the write operation has been conducted again or not; B5 is an erase check bit indicating the result of erase operation and B4 is a write check bit indicating the result of write operation.

In the second embodiment, the bits B3 to B0 which are provided as the auxiliary bits in the first embodiment are used as the bits for indicating the contents of error. Table 3 indicates a relationship between the setting conditions of the bits B7 to B0 and respective error contents.

TABLE 3

| Bit Conditions | | | | | | | | |
|---|---|---|---|---|---|---|---|---|
| 7 | 6 | 5 | 4 | 3 | 2 | 1 | 0 | Contents |
| * | 0 | * | 1 | * | * | * | 1 | VWV1 Fail |
| * | 0 | * | 1 | * | * | 1 | * | VWV2 Fail |
| * | 0 | * | 1 | * | 1 | * | * | VWV3 Fail |
| * | 0 | * | 1 | 1 | * | * | * | VWV4 Fail |
| * | 1 | * | * | * | * | * | 1 | VWV1 Fail |
| * | 1 | * | * | * | * | 1 | * | VWE2 Fail |
| * | 1 | * | * | * | 1 | * | * | VWE3 Fail |

The bit B3 among the bits B3 to B0 is a check bit which means, when it is set to the logic "1", that a memory cell having the threshold voltage lower than the write verify voltage VWV4 is still left in the verify (step S8) after the write operation of level 4.

On the other hand, B2 to B0 among the bits B3 to B0 indicate, when these are set to the logic "1", that an error is generated and the error contents of these are different depending on the conditions of the retry check bit B6. In practical, when B2 is "1" while B6 is "0" it means an error that the memory cell having the threshold voltage lower than the write verify voltage VWV1 is still left in the verify operation (step S5) after the first retry of write operation. When B2 is "1" while the bit B6 is "1", it means an error that it is determined that the memory cell having the threshold voltage higher than the erase verify voltage VWE1 is still left in the verify operation (step S15) explained above.

Moreover, when B1 is "1" while the bit B6 is "0", it means an error that a memory cell having completed the write operation of level 2 (step S11) and having the threshold voltage lower than the verify voltage VWV2 is still left. When B1 is "1" while the bit B6 is "1", it means an error as a result of determination that there is a memory cell having the threshold voltage higher than the erase verify voltage VWE2 in the verify operation (step S14) explained above.

Moreover, when B0 is "1" while the bit B6 is "0", it means an error that a memory cell having completed the write operation (step S9) of level 3 and having the threshold voltage lower than the verify voltage VWV3 is still left. When B0 is "1" while the bit B6 is "1", it means an error as a result of determination that there is a memory cell having the threshold voltage higher than the erase verify voltage VWE3 in the verify operation (step S13) explained above.

Figure 7:
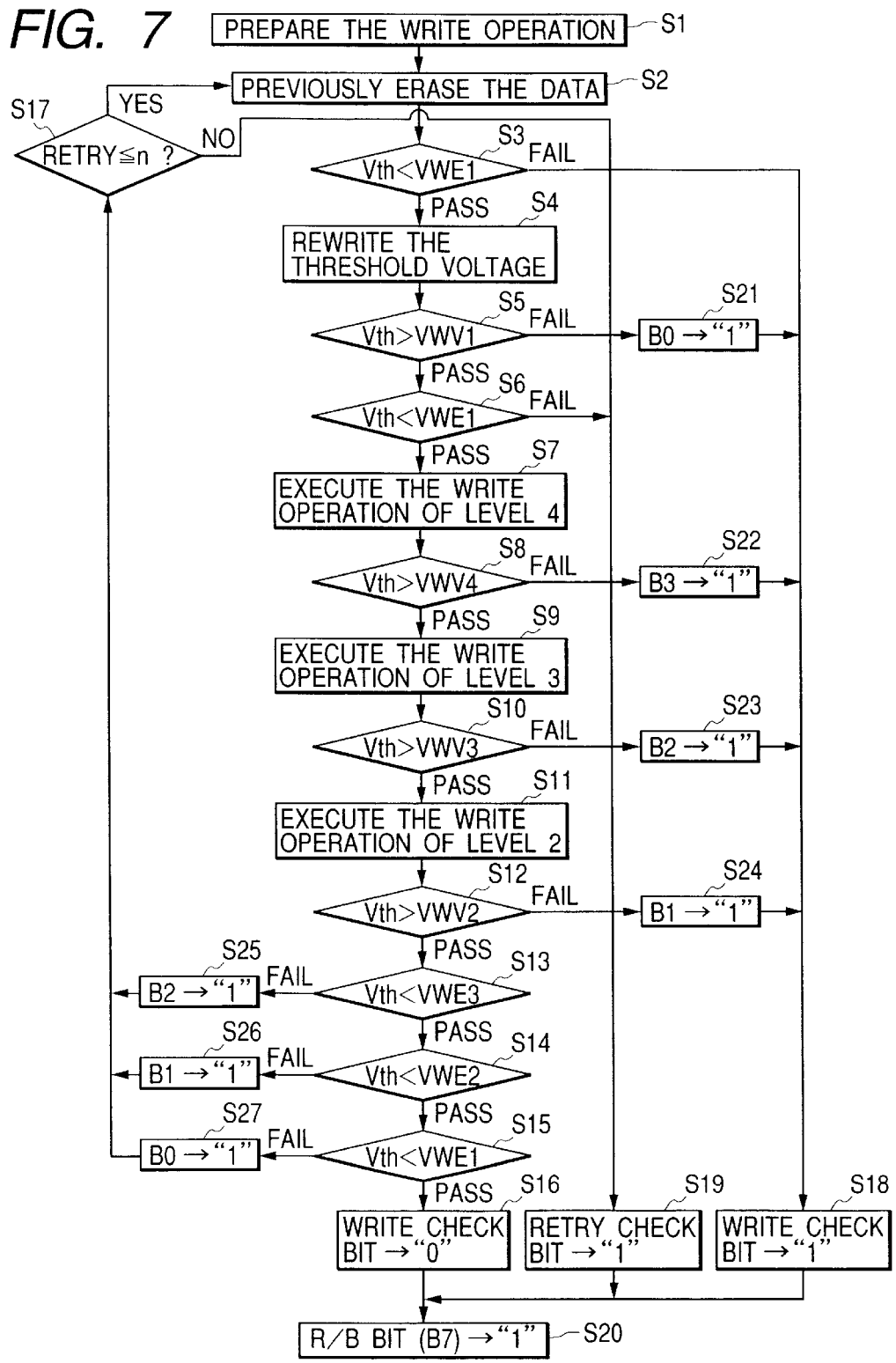
FIG. 7 is a flow chart illustrating the second embodiment of the write process and practical setting procedures of each bit of status register in the flash memory of FIG. 1.

FIG. 7 shows the practical setting sequence of bits to the bits B7 to B0 in the case where the status register 32 of the second embodiment (Table 2) is used. The flowchart of FIG. 7 is almost identical to that of FIG. 5. Only difference is that the steps S21 to S27 for setting the bits B3 to B0 are added.

In more practical, the flowchart of FIG. 7 comprises: the step S21 for setting the bit B0 to "1" when it is determined in the verify operation (step S5) after the first re-write operation that a memory cell having the threshold voltage lower than the verify voltage VWV1 is still left; the step S22 for setting the bit B3 to "1" when it is determined in the verify operation (step S8) after the write operation of level 4 that a memory cell having the threshold voltage lower than the write verify voltage VWV4 is still left; the step S23 for setting the bit B2 to "1" when it is determined in the verify operation (Step S10) after the write operation of level 3 that a memory cell having the threshold voltage lower than the write verify voltage VWV3 is still left; and the step S24 for setting the bit B1 to "1" when it is determined in the verify operation (step S12) after the write operation of level 2 that a memory cell having the threshold voltage lower than the write verify voltage VWV2 is still left.

Moreover, the flowchart of FIG. 7 is also provided with: the step S25 for setting the bit B2 to "1" when it is determined in the verify operation of the step S13 that a memory cell having the threshold voltage higher than the erase verify voltage VWE3 is left; the step S26 for setting the bit B1 to "1" when it is determined in the verify operation of step S14 that a memory cell having the threshold voltage higher than the erase verify voltage VWE2 is left; and the step S27 for setting the bit B0 to "1" when it is determined in the verify operation of the step S15 that a memory cell having the threshold voltage higher than the erase verify voltage VWE1 is left.

Figure 8:
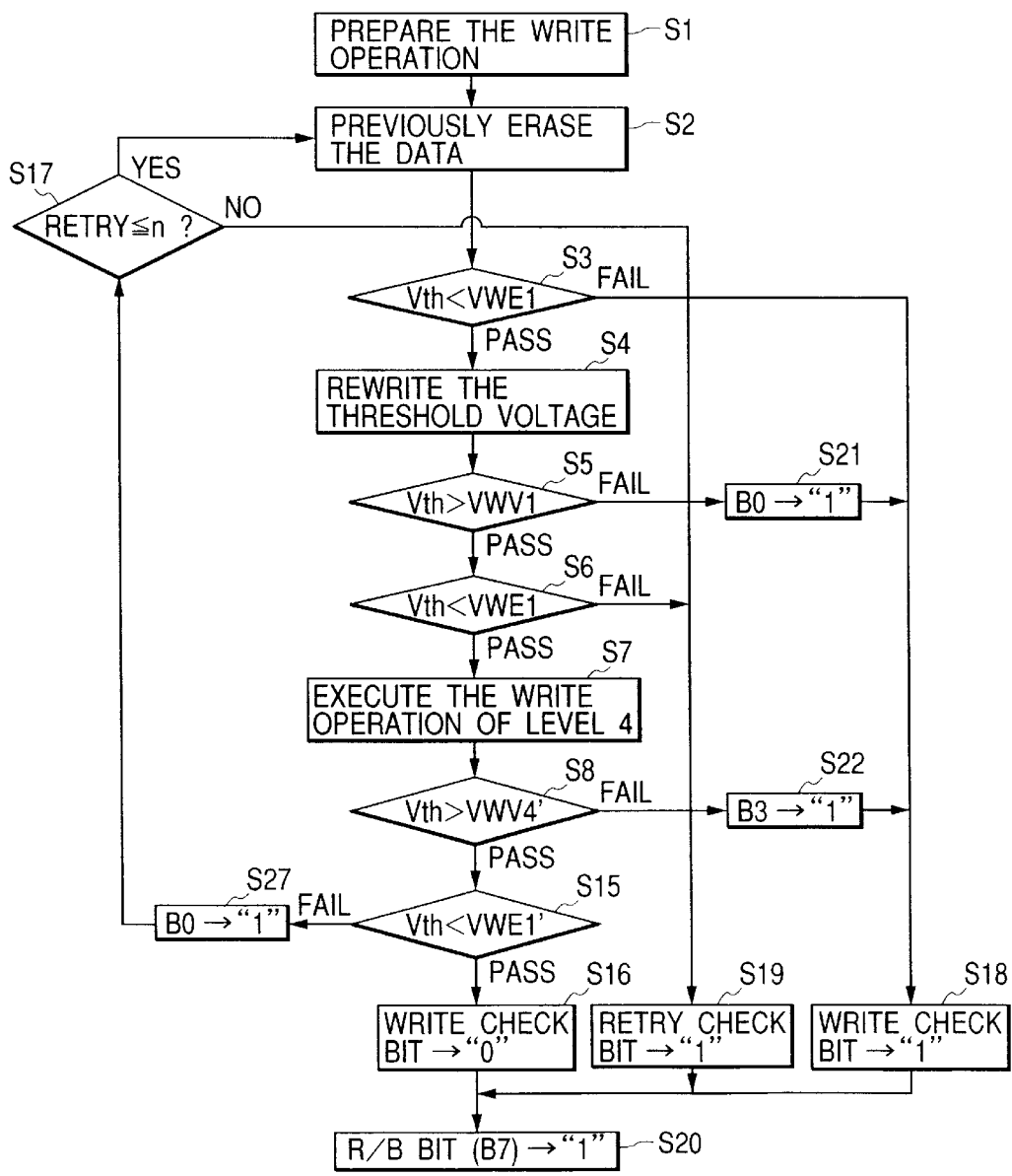
FIG. 8 is a flow chart illustrating the write process and practical setting procedures of status register in the case of writing the 2-level data in the flash memory of FIG. 1.

FIG. 8 illustrates the sequence for writing an ordinary 2-level data, in place of 4-level, to the memory array of the flash memory of FIG. 1, while the Table 4 indicates the contents of bits B7 to B0 of the status register 32 in the case of such data writing operation.

TABLE 4

| Bit Conditions | | | | | | | | |
|---|---|---|---|---|---|---|---|---|
| 7 | 6 | 5 | 4 | 3 | 2 | 1 | 0 | Contents |
| * | 0 | * | 1 | * | * | * | 1 | VWV1 Fail |
| * | * | * | * | * | * | * | * | VWV2 Fail |
| * | * | * | * | * | * | * | * | VWV3 Fail |
| * | * | * | 1 | 1 | * | * | * | VWV4 Fail |
| * | 1 | * | * | * | * | * | 1 | VWE1 Fail |
| * | * | * | * | * | * | * | * | VWE2 Fail |
| * | * | * | * | * | * | * | * | VWE3 Fail |

Differences between the flowcharts of FIG. 8 and FIG. 7 are that the steps S9 to S14, S23 to S26 in the flowchart of FIG. 7 are eliminated in the flowchart of FIG. 8 and that the verify voltage VWV4' in the step S8 and the verify voltage VWE1' in the step S15 are rather loosened in comparison with that of flowchart of FIG. 7 for the multi-level data (VWV<VWV4', VWE1<VWE1')

Figure 9:
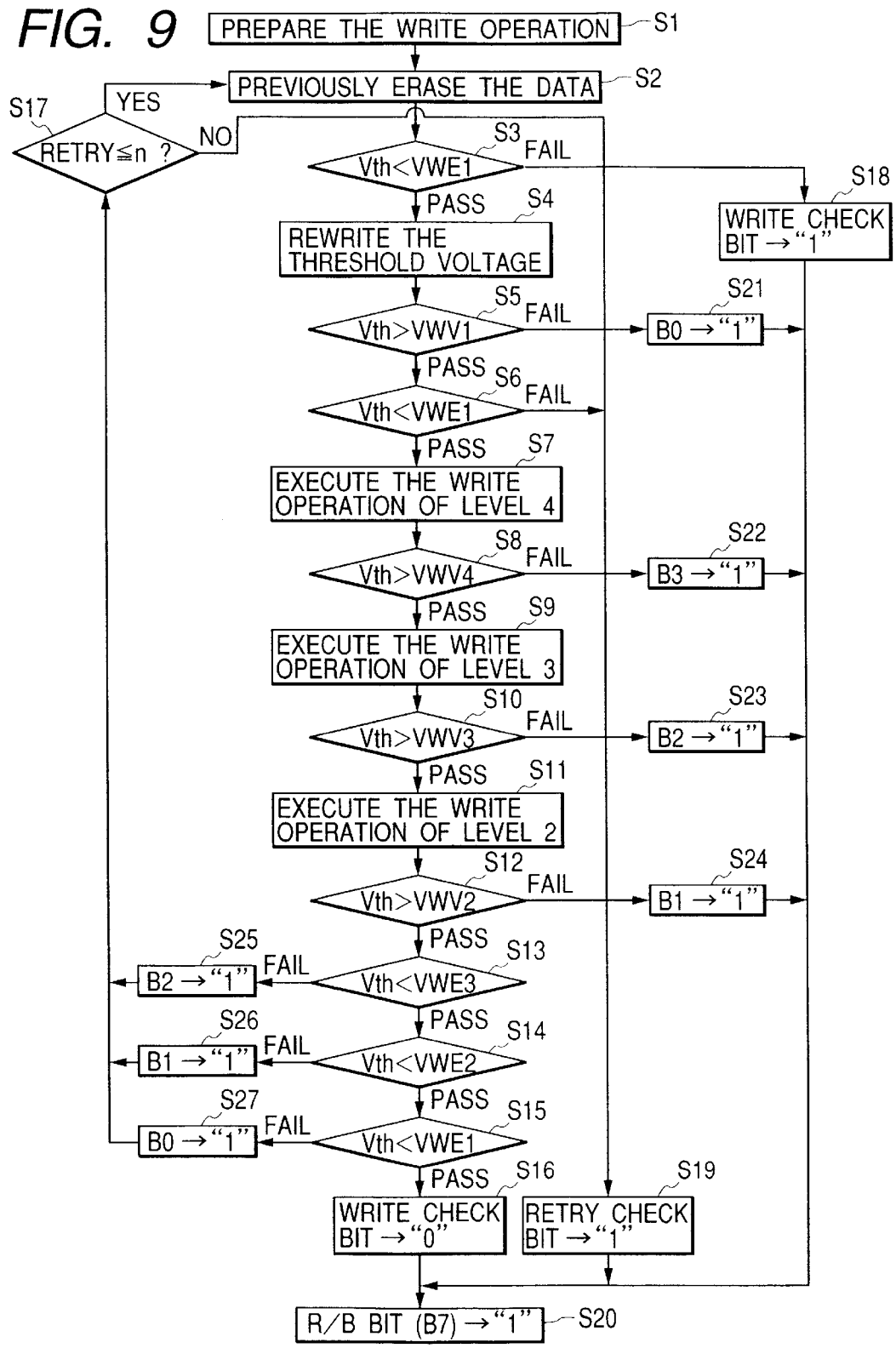
FIG. 9 is a flow chart illustrating the third embodiment of the write process and practical setting procedures of each bit of status register in the flash memory of FIG. 1.
Figure 10A:
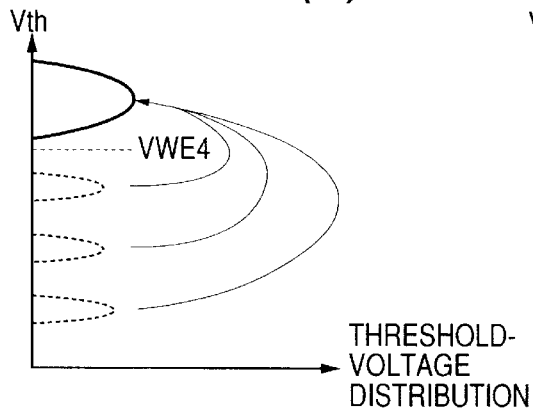
FIG. 10 is an explanatory diagram illustrating the relationship between change of threshold voltage and verify voltage in the flash memory of the system for raising the threshold voltage of the memory cell with the erasing operation and for lowering the threshold voltage of memory cell with the write operation.
Figure 10D:
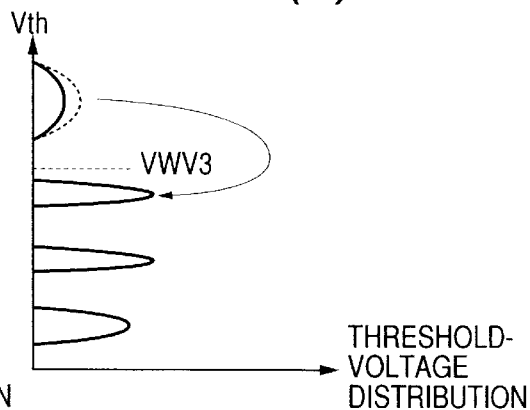
Figure 10B:
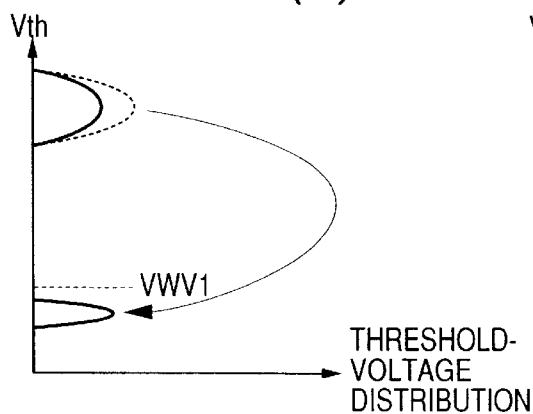
Figure 10E:
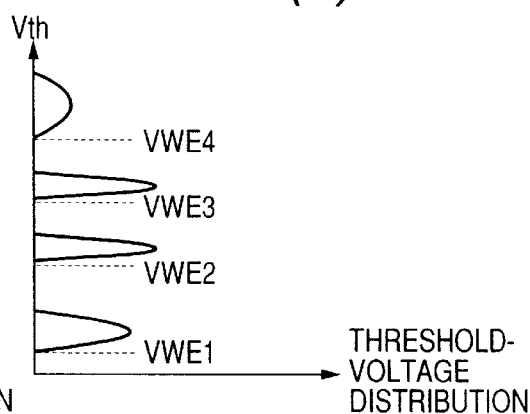
Figure 10C:
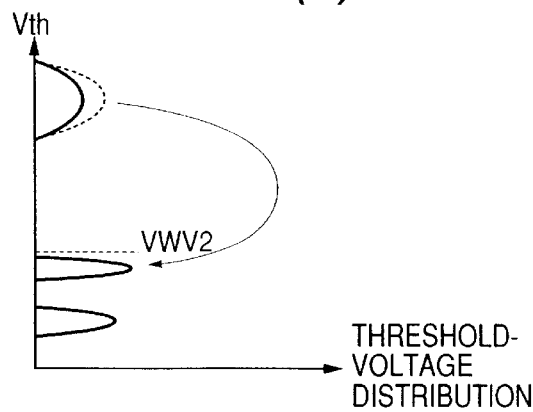

FIG. 9 illustrates the third embodiment of the present invention. Structure of the status register 32 used in this embodiment is identical to that of the second embodiment illustrated in the Table 2, but contents of the bits B7 to B0 are a little different from that in the second embodiment. Table 5 indicates a relationship between the setting conditions of the bits B7 to B0 in this third embodiment and contents of errors of such bits.

TABLE 5

| Bit Conditions | | | | | | | | |
|---|---|---|---|---|---|---|---|---|
| 7 | 6 | 5 | 4 | 3 | 2 | 1 | 0 | Contents |
| * | 0 | * | * | * | * | * | 1 | VWV1 Fail |
| * | 0 | * | * | * | * | 1 | * | VWV2 Fail |
| * | 0 | * | * | * | 1 | * | * | VWV3 Fail |
| * | 0 | * | * | 1 | * | * | * | VWV4 Fail |
| * | 1 | * | * | * | * | * | 1 | VWE1 Fail |
| * | 1 | * | * | * | * | 1 | * | VWE2 Fail |
| * | 1 | * | * | * | 1 | * | * | VWE3 Fail |

Difference between the Table 5 and Table 3 indicating a relationship between the setting conditions of the bits B7 to B0 and contents of error of such bits in the second embodiment is that the bits B3 to B0 have the significance only when the bit B4 is logic "1" in the second embodiment, namely the bit B4 is always logic "1" when any one of the bits B3 to B0 is logic "1", however, in this third embodiment, the bits B3 to B0 have the significance without relation to the condition of the bit B4, namely condition of the bit B4 is unstable even when any one of the bits B3 to B0 is logic "1".

Such difference occurs because logic "1" is set to the error condition to the bits B3 to B0 in the steps S21 to S24 and thereafter logic "1" is set as the error condition to the bit B4 as the write check bit after shifting to the step S18 in the flow chart of FIG. 7, but on the other hand, in the flow chart of FIG. 9, the logic "1" is set as the error condition to the bit B4 as the write check bit after shifting to the step S18 only when a memory cell having the threshold voltage not lower than the erase verify voltage VWE1 is left in the verify operation after the pre-erase in the step S3 and the process does not shift to the step S18 for setting the logic "1" to the write check bit when the logic "1" is set as the error condition to the bits B3 to B0 in the steps S21 to S24.

As explained above, the flash memory to which the present invention is applied is constituted to provide the bits B3 to B0 for indicating the more practical content of the write error to the status register 32 and to detect the bit conditions from the external side. Therefore, when an external CPU or the like reads the conditions of bits B3 to B0 indicating the error condition, it executes retry of write operation by giving again the write command, address and data to effectively utilize the sectors which have been registered as the defective sectors and removed from the effective memory area. Namely, when the write operation is performed again even if the write error such as an error condition indicated with the bits B3 to B0 is generated, it is understood from the experiment that the possibility for completing the write operation without error is considerably high. Therefore, such artificial fault sector can be used as the good sector and the effective memory capacity can be increased by applying the present invention. Moreover, the error condition of bits B3 to B0 can also be used for conducting the fault analysis of the memory.

The embodiments of the present invention have been explained above practically, but the present invention is not limited to the above embodiments and allows various changes and modifications without departing from the scope of the claims. For example, in above embodiment, the flash memory of the type to decrease the threshold voltage of the memory cell with the erase operation and to increase the threshold voltage with the write operation has been explained, but the present invention can also be applied to the flash memory of the type to increase the threshold voltage of the memory cell with the erase operation and to decrease the threshold voltage with the write operation. FIG. 10 illustrates distribution, on the time axis, of threshold voltages of memory cell changing in the course of write operation. In FIG. 10, (a) is the condition changed with the preceding erase operation, (b) is the condition after the write operation to the memory cell requested to have the lowest threshold voltage, (c) is the condition after the write operation to the memory cell requested to have the second lowest threshold voltage, (d) is the condition after the write operation to the memory cell requested to have the third lowest threshold voltage and (e) is the condition of ideal threshold voltage distribution after the final verify. Although not particularly restricted, generation of disturbance fault can be reduced by sequentially conducting the write operation from the memory cell having the threshold voltage furthest from that of the erase condition at the time of write operation as illustrated in FIG. 6 and FIG. 10. As the other writing sequence, the parallel write operation can also be executed to all memory cells for which the write operation to change the threshold voltage to a certain voltage is performed.

Moreover, in the embodiments, content of the status register 32 is outputted from the input/output terminal I/O0 to I/O7 depending on the condition of the chip enable signal CE and out-enable signal OE among the control signals inputted to the flash memory from external circuit, but it is also possible to form the structure to output the content through the combination of the other control signals, to always output the content of status register 32 from the input/output terminals I/O0 to I/O7 when the ready/busy signal R/B is high level indicating the ready condition and to read the content of status register by assigning the address to the status register 32 and providing the decoder and then giving the address from the external side.

In addition, in above embodiments, the write and erase operations for the memory device having the floating gate are conducted respectively utilizing the FN tunnel phenomenon, but the present invention can also be applied to the flash memory constituted to conduct the write operation with hot-electrons generated by applying the drain current and to conduct the erase operation by utilizing the FN tunnel phenomenon.

In above explanation, the present invention is applied to the flash memory as the application field of the background, but the present invention is not limited thereto and can be widely applied to a non-volatile memory device for changing the threshold voltage by applying a voltage to realize the storing of information.

The effect of the typical inventions disclosed in this specification is as follows.

Namely, according to the present invention, an electrically programmable and erasable non-volatile semiconductor memory device can prevent reduction of effective memory capacity due to an accidental write error and can easily analyze a fault such as write error.

What is claimed is:

1. A nonvolatile memory device comprising:

a plurality of memory cells; and a status register, wherein each of said memory cells has a threshold voltage within one of a plurality of threshold voltage ranges, one of which is for an erase state and others are for program states, said nonvolatile memory is capable of performing an erase operation and a program operation, in said erase operation each threshold voltage of selected memory cells of said plurality moves within a threshold voltage range for said erase state, and in said program operation each threshold voltage of said selected memory cells moves within a desired threshold voltage range according to data, wherein said status register has a plurality of status bits, wherein a first bit in said status bits indicates performance of said erase operation or said program operation, wherein a second bit in said status bits indicates whether all threshold voltages of said selected memory cells move within the desired threshold voltage range or at least one threshold voltage of said selected memory cells does not move within the desired threshold voltage range, and wherein a third bit in said status bits indicates that at least one threshold voltage of said selected memory cells moves over the desired threshold voltage range.

2. A nonvolatile memory device according to claim 1, wherein the program operation to the selected memory cells can be realized by once moving the threshold voltage of the selected memory cells within the threshold voltage range for said erase state and then moving the threshold voltage of the selected memory cells within the desired threshold voltage range.

3. A nonvolatile memory device according to claim 2, wherein the third bit is set to a condition to indicate an error when the threshold voltage of a selected memory cell moves over the desired threshold voltage range even after the program operation to the selected memory cell is conducted more than a predetermined number of times.

4. A nonvolatile memory device according to claim 3, wherein said second bit is set to a condition to indicate an error when at least one threshold voltage of the selected memory cells is not within the desired threshold voltage range for the erase state in a verify read operation that is executed immediately after performing the erase operation.

5. A nonvolatile memory device according to claim 4, wherein said status register is also provided with a fourth bit indicating whether or not the threshold voltage of the selected memory cells in which the program operation is carried out exceeds an upper limit value or a lower limit value of the desired threshold voltage range.

6. A nonvolatile memory device according to claim 5, wherein contents of said status register are outputted to an external terminal when a plurality of control signals supplied from the external side of a chip of the memory device are combined as predetermined.

7. A nonvolatile memory device according to claim 5, wherein the condition of the first bit of said status register is always outputted to an exclusive external terminal of a chip of the memory device.

8. A nonvolatile memory device according to claim 5, wherein content of said status register is outputted to an external terminal used in common for input of write information supplied from the external side of a chip of the memory device.

9. A nonvolatile memory device according to claim 5, wherein content of said status register is outputted to an external terminal used in common for input of write addresses supplied from the external side of a chip of the memory device.

10. A nonvolatile memory device according to claim 1, further comprising a control circuit, wherein said control circuit executes a process corresponding to a command code by forming control signals for internal circuits of the memory device based on said command code supplied from the external side of a chip of the memory device, wherein said status register is provided in said control circuit.

* * * * *